United States Patent
Tomita et al.

(10) Patent No.: US 9,054,103 B2
(45) Date of Patent: Jun. 9, 2015

(54) SEMICONDUCTOR DEVICE

(75) Inventors: Kazuo Tomita, Kawasaki (JP);
Toshiyuki Oashi, Kawasaki (JP);
Hidenori Sato, Kawasaki (JP)

(73) Assignee: Renesas Electronics Corporation,
Kawasaki-shi (JP)

( * ) Notice: Subject to any disclaimer, the term of this patent is extended or adjusted under 35 U.S.C. 154(b) by 0 days.

(21) Appl. No.: 14/112,926

(22) PCT Filed: Mar. 26, 2012

(86) PCT No.: PCT/JP2012/057690
§ 371 (c)(1),
(2), (4) Date: Oct. 19, 2013

(87) PCT Pub. No.: WO2012/144295
PCT Pub. Date: Oct. 26, 2012

(65) Prior Publication Data
US 2014/0043063 A1 Feb. 13, 2014

(30) Foreign Application Priority Data
Apr. 20, 2011 (JP) ................................. 2011-093880

(51) Int. Cl.
*H01L 23/52* (2006.01)
*H01L 27/02* (2006.01)
*H01L 21/8238* (2006.01)

(52) U.S. Cl.
CPC ............ *H01L 23/52* (2013.01); *H01L 27/0207* (2013.01); *H01L 21/823871* (2013.01); *H01L 2924/0002* (2013.01)

(58) Field of Classification Search
USPC .......... 326/101–103; 257/202–211, 288, 369, 257/368
See application file for complete search history.

(56) References Cited

U.S. PATENT DOCUMENTS 5,490,095 A    2/1996 Shimada et al.

FOREIGN PATENT DOCUMENTS

| JP | 2-170437 A | 7/1990 |
| JP | 5-198593 A | 8/1993 |
| JP | 7-007143 A | 1/1995 |
| JP | 11-103054 A | 4/1999 |
| JP | 11-330461 A | 11/1999 |
| JP | 2009-032788 A | 2/2009 |

OTHER PUBLICATIONS

Office Action issued Nov. 11, 2014, in Japanese Patent Application No. 2013-510924.

*Primary Examiner* — Tung X Le
*Assistant Examiner* — Jonathan Cooper
(74) *Attorney, Agent, or Firm* — Miles & Stockbridge PC

(57) ABSTRACT

A gate interconnection portion includes a first gate interconnection portion, a second gate interconnection portion, and a third gate interconnection portion. The first gate interconnection portion is formed in parallel to a Y axis direction toward a power supply interconnection and extends to a prescribed position within an element formation region. The second gate interconnection portion is formed in parallel to a direction obliquely bent with respect to the Y-axis direction from the first gate interconnection portion toward the power supply interconnection, and extends across a boundary between the element formation region and an element isolation insulating film, which is in parallel to an X axis direction. The third gate interconnection portion further extends in parallel to the Y-axis direction from the second gate interconnection portion toward the power supply interconnection.

7 Claims, 21 Drawing Sheets

SEMICONDUCTOR DEVICE

TECHNICAL FIELD

The present invention relates to a semiconductor device, and particularly to a semiconductor device applied to a logic circuit.

BACKGROUND ART

In a logic circuit or the like, a plurality of cells are combined, with one inverter circuit being defined as one cell. In a cell of an inverter circuit, if it is assumed that cells are arranged in an X-Y plane, a power supply interconnection and a ground interconnection spaced apart from each other extend in an X-axis direction. An n-channel type field effect transistor and a p-channel type field effect transistor are connected in series between the ground interconnection and the power supply interconnection. In addition, a gate interconnection portion extends in a Y-axis direction orthogonal to the X-axis direction.

A size of a cell is represented by a pitch and a grid. A pitch defines a length in the X-axis direction and a grid defines a length in the Y-axis direction. A length of 1 pitch is equal to a length of 1 grid. Normally, 1 pitch is a minimum pitch of a first interconnection, and it is defined as a length which is a sum of an interconnection width of the first interconnection and an interval between adjacent first interconnections.

Cells of conventional inverter circuits include a cell of 3 pitches and 9 grids, a cell of 3 pitches and 7 grids, or the like. Here, if it is assumed that a first interconnection has an interconnection width L of 180 nm and an interval S of 180 nm, a minimum pitch of the first interconnection is 360 nm, and a cell of 3 pitches and 7 grids has a length in the X-axis direction of 1080 nm (360 nm×3) and a length in the Y-axis direction of 2520 nm (360 nm×7). It is noted that, for example, Japanese Patent Laying-Open No. 11-330461 (PTD 1) and Japanese Patent Laying-Open No. 05-198593 (PTD 2) are exemplified as documents disclosing a field effect transistor applied to such a cell of an inverter circuit.

CITATION LIST

Patent Document

PTD 1: Japanese Patent Laying-Open No. 11-330461
PTD 2: Japanese Patent Laying-Open No. 05-198593

SUMMARY OF INVENTION

Technical Problem

In order to adapt to reduction in size of electronic devices or the like, a semiconductor device including a logic circuit has also recently be required to have a smaller size. The present invention was made as a part of development thereof, and an object thereof is to provide a semiconductor device achieving reduction in size of a cell constituting a logic circuit.

Solution to Problem

A semiconductor device according to one embodiment of the present invention is a semiconductor device including an inverter circuit in which complementary switching elements are connected in series between a power supply potential and a ground potential, and the semiconductor device includes a semiconductor substrate having a main surface, a power supply interconnection to which a power supply potential is applied, a ground interconnection to which a ground potential is applied, an element formation region for the complementary switching element, and a gate interconnection portion. The power supply interconnection is formed on a surface of the semiconductor substrate and extends in parallel to a first direction. The ground interconnection is formed on the surface of the semiconductor substrate and extends in parallel to the first direction at a distance from the power supply interconnection in a second direction orthogonal to the first direction. The element formation region is defined by an element isolation insulating film in a region of the semiconductor substrate lying between the power supply interconnection and the ground interconnection. The gate interconnection portion is formed to intersect the element formation region. The gate interconnection portion includes a first gate interconnection portion and a second gate interconnection portion. The first gate interconnection portion is formed in parallel to the second direction from one side to the other side of sides where the power supply interconnection and the ground interconnection are arranged, respectively, and extends to a prescribed position within the element formation region. The second gate interconnection portion is formed in parallel to a third direction obliquely crossing the second direction, from the first gate interconnection portion toward the other side, and extends across a boundary in parallel to the first direction, which is a boundary between the element formation region and the element isolation insulating film.

A semiconductor device according to another embodiment of the present invention has a semiconductor substrate having a main surface, an element formation region, and a gate interconnection portion. The element formation region is defined by an element isolation insulating film in the semiconductor substrate. The gate interconnection portion is formed to intersect the element formation region. The gate interconnection portion includes a first gate interconnection portion and a second gate interconnection portion. The first gate interconnection portion is formed in a direction orthogonal to a direction in which a boundary between the element formation region and the element isolation insulating film extends, toward the boundary, and extends to a prescribed position within the element formation region. The second gate interconnection portion bends from the first gate interconnection portion and extends obliquely across the boundary.

Advantageous Effects of Invention

According to the semiconductor device in one embodiment of the present invention, a cell can be reduced in size and an area occupied as the semiconductor device can be decreased.

According to the semiconductor device in another embodiment of the present invention, a cell can be reduced in size and an area occupied as the semiconductor device can be decreased.

DESCRIPTION OF EMBODIMENTS

Figure 1:
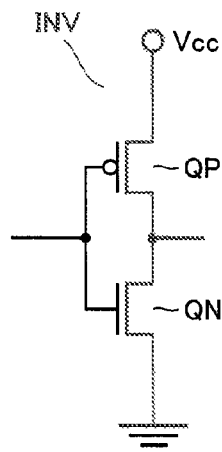
FIG. 1 is a circuit diagram showing an inverter circuit in a semiconductor device according to each embodiment of the present invention.

In an inverter circuit which is a basis (unit) for constructing a logic circuit, as shown in FIG. 1, a p-channel type field effect transistor QP and an n-channel type field effect transistor QN are connected in series between a power supply potential (Vcc) and a ground potential. A semiconductor device including a gate interconnection portion capable of achieving reduction in size of the cell of such an inverter circuit INV will specifically be described in each embodiment.

First Embodiment

Figure 2:
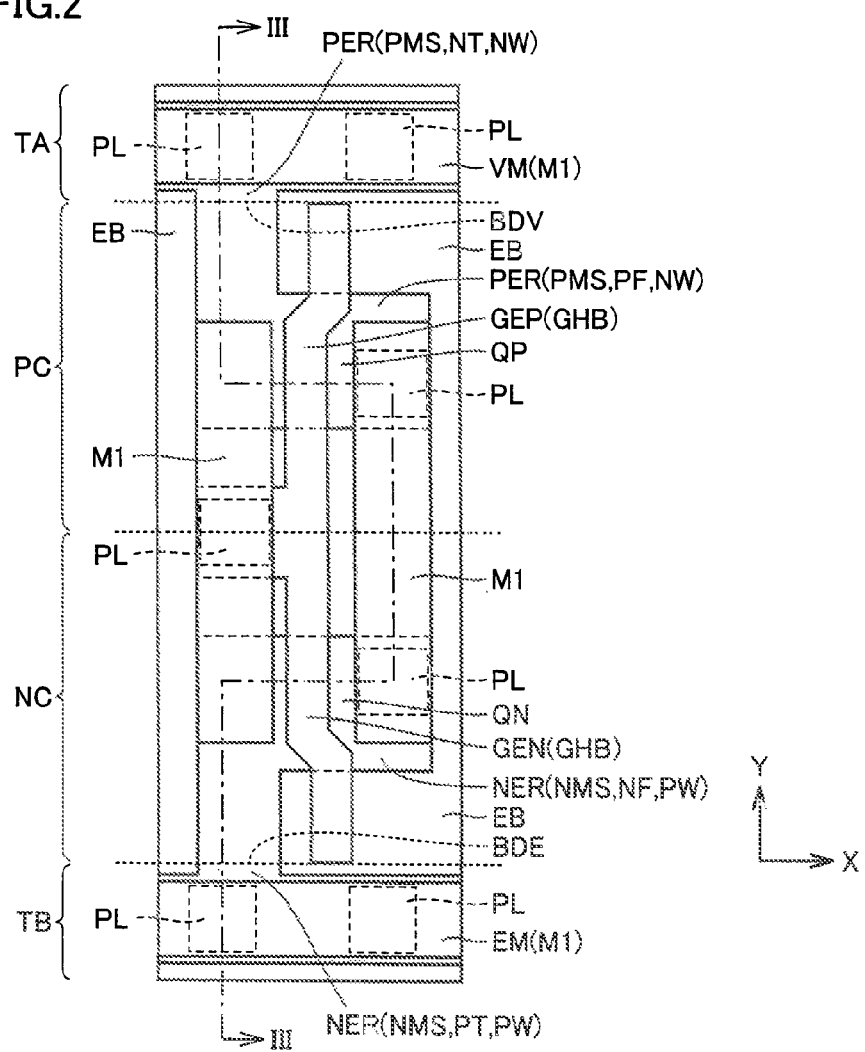
FIG. 2 is a plan view showing a cell of an inverter circuit in a semiconductor device according to a first embodiment of the present invention.
Figure 3:
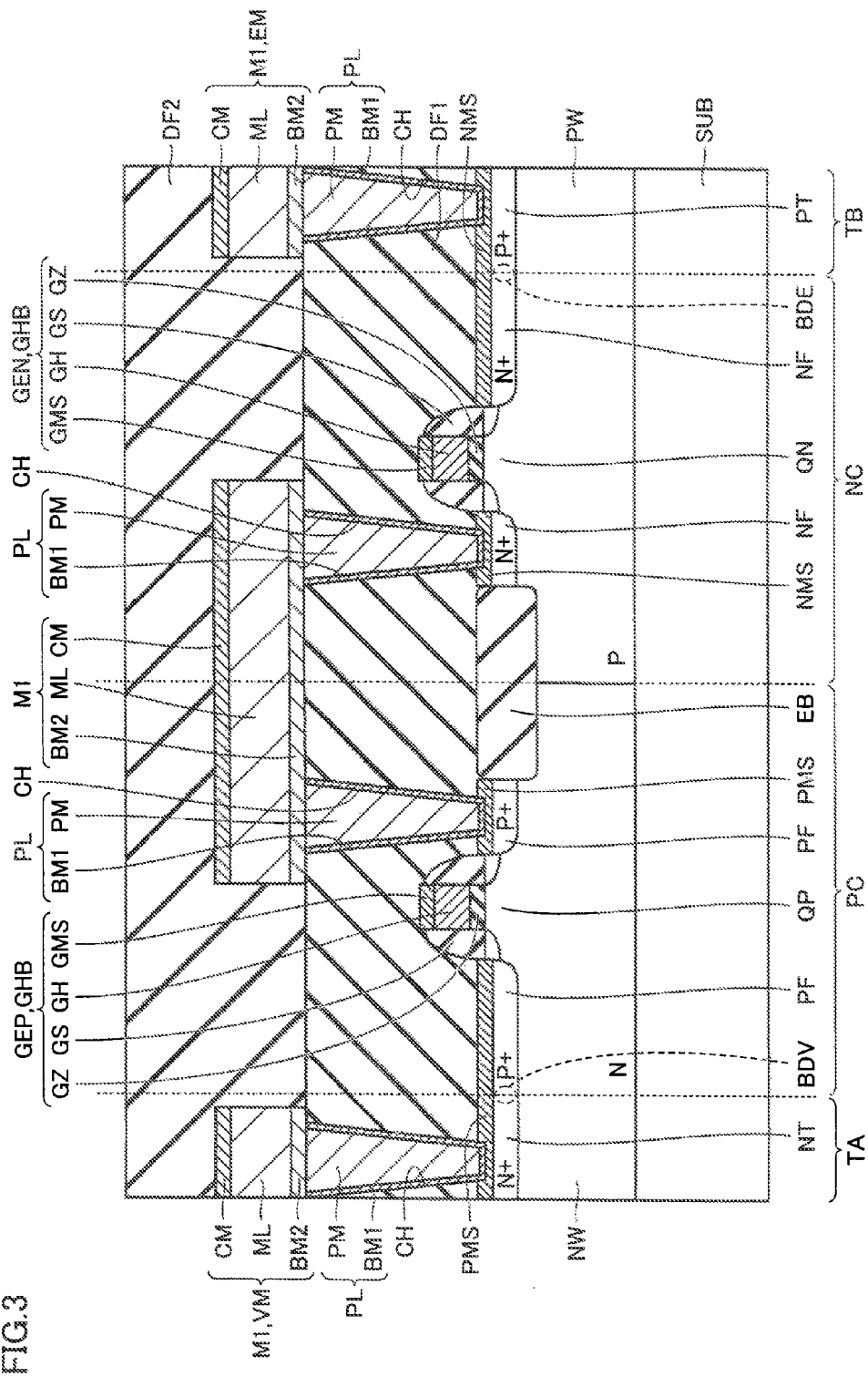
FIG. 3 is a cross-sectional view along the section line III-III shown in FIG. 2 in the first embodiment.

A semiconductor device in which a gate interconnection portion is bent twice will be described in a first embodiment. As shown in FIGS. 2 and 3, in a surface of a semiconductor substrate SUB in a cell of an inverter circuit, two element formation regions PER, NER (active regions) electrically isolated from each other by an element isolation insulating film EB are defined. In one element formation region PER, an N well NW is formed from its surface to a prescribed depth. In the other element formation region NER, a P well PW is formed from its surface to a prescribed depth.

In N well NW, a tap portion TA to which a power supply potential is applied and a p-channel region PC in which a channel of a p-channel type field effect transistor is formed are formed. In tap portion TA, an N+ impurity region NT is formed from the surface of N well NW to a prescribed depth. Tap portion TA is formed along a power supply interconnection VM which will be described later, in a region directly under the same.

In P well PW, a tap portion TB to which a ground potential is applied and an re-channel region NC in which a channel of an n-channel type field effect transistor is formed are formed. In tap portion TB, a P+ impurity region PT is formed from the surface of P well PW to a prescribed depth. Tap portion TB is formed along a ground interconnection EM which will be described later, directly under the same.

A gate interconnection portion GHB is formed to intersect element formation region PER and element formation region NER. In gate interconnection portion GHB, for example, a gate interconnection main body GH formed from a polysilicon film having a film thickness of approximately 200 nm is formed on a gate insulating film GZ having a film thickness of approximately 3 nm. Gate interconnection main body GH has a width (a direction in a gate length), for example, of approximately 100 nm. On an upper surface of gate interconnection main body GH, a metal silicide film GMS having a film thickness of approximately 15 nm and made of cobalt silicide or the like is formed. On a side surface of gate interconnection main body GH and the like, a sidewall insulating film GS having a film thickness of approximately 60 nm and formed from a stack film of a silicon oxide film and a silicon nitride film is formed. In addition, a length in the Y-axis direction of each of element formation region PER and element formation region NER is, for example, 0.4 μm.

A portion in gate interconnection portion GHB crossing element formation region PER serves as a gate electrode portion GEP of p-channel type field effect transistor QP. In addition, in each of a portion on one side and a portion on the other side of element formation region PER with gate electrode portion GEP lying therebetween, a P+ impurity region PF serving as source and drain is formed from its surface to a prescribed depth.

A portion in gate interconnection portion GHB crossing element formation region NER serves as a gate electrode portion GEN of n-channel type field effect transistor QN. In addition, in each of a portion on one side and a portion on the other side of element formation region NER with gate electrode portion GEN lying therebetween, an N+ impurity region NF serving as source and drain is formed from its surface to a prescribed depth.

On a surface of N+ impurity region NT located in tap portion TA and on a surface of P+ impurity region PF located in p-channel region PC, for example, a metal silicide film PMS formed from a cobalt silicide film or the like is formed. In addition, on a surface of P+ impurity region PT located in tap portion TB and on a surface of N+ impurity region NF located in n-channel region NC as well, a metal silicide film NMS formed from a cobalt silicide film or the like is formed.

For example, a first interlayer insulating film DF1 having a film thickness of approximately 500 nm is formed on semiconductor substrate SUB so as to cover gate interconnection portion GHB, through a chemical mechanical polishing process. In a portion of first interlayer insulating film DF1 located in tap portion TA, a contact hole CH exposing metal silicide film PMS is formed. In a portion of first interlayer insulating film DF1 located in p-channel region PC, contact hole CH exposing metal silicide film PMS is formed. In addition, in a portion of first interlayer insulating film DF1 located in tap portion TB, contact hole CH exposing metal silicide film NMS is formed. In a portion of first interlayer insulating film DF1 located in n-channel region NC, contact hole CH exposing metal silicide film NMS is formed.

In each contact hole CH, a plug PL containing a barrier metal layer BM1 and an embedding metal layer PM is formed. As barrier metal layer BM1, for example, titanium nitride having a film thickness of approximately 10 nm is stacked on titanium having a film thickness of 10 nm. In addition, for example, tungsten is formed as metal layer PM.

On a surface of the portion of first interlayer insulating film DF1 located in tap portion TA, a power supply interconnection VM to which a power supply potential is applied is formed. Power supply interconnection VM is electrically connected to one source and drain (metal silicide film PMS) of the p-channel type field effect transistor through plug PL. In addition, a power supply potential (for example, 1.5 V) is applied to N well NW through power supply interconnection VM.

On a surface of the portion of first interlayer insulating film DF1 located in tap portion TB, a ground interconnection EM to which a ground potential is applied is formed. The ground interconnection is electrically connected to one source and drain (metal silicide film NMS) of the n-channel type field effect transistor through plug PL. In addition, a ground potential (0 V) is applied to P well PW through ground interconnection EM. If it is assumed that cells are arranged in the X-Y plane, power supply interconnection VM and ground interconnection EM both extend in parallel to the X-axis direction (a first direction). In addition, power supply interconnection VM and ground interconnection EM are spaced apart from each other in the Y-axis direction orthogonal to the X-axis.

A first metal interconnection M1 is formed to bridge a surface of the portion of first interlayer insulating film DF1 located in p-channel region PC and a surface of the portion of first interlayer insulating film DF1 located in n-channel region NC. First metal interconnection M1 electrically connects through plug PL, the other source and drain (metal silicide film PMS) of the p-channel type field effect transistor and the other source and drain (metal silicide film NMS) of the n-channel type field effect transistor to each other.

Each of power supply interconnection VM, ground interconnection EM, and first metal interconnection M1 has a structure obtained by stacking a barrier metal layer BM2, a metal layer ML, and a cap metal layer CM. As barrier metal layer BM2, for example, titanium nitride having a film thickness of approximately 20 nm is stacked on titanium having a film thickness of 10 nm. In addition, for example, an aluminum film having a film thickness of approximately 220 nm is formed as metal layer ML. As cap metal layer CM, for example, titanium nitride having a film thickness of approximately 20 nm is stacked on titanium having a film thickness of 10 nm. A second interlayer insulating film DF2 is formed on first interlayer insulating film DF1 so as to cover power supply interconnection VM, ground interconnection EM, and first metal interconnection M1.

Figure 4:
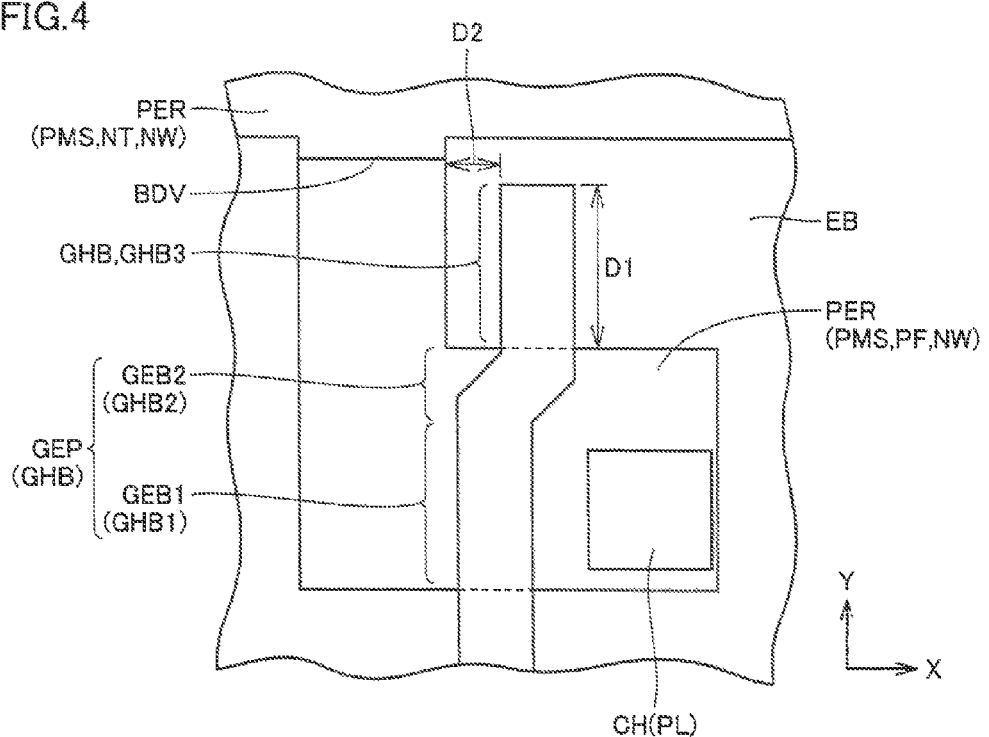
FIG. 4 is a partially enlarged plan view showing a gate interconnection portion and a portion around the same in the first embodiment.

A structure of gate interconnection portion GHB will now be described in further detail. As shown in FIG. 4, gate interconnection portion GHB includes a first gate interconnection portion GHB1 including a first gate electrode portion GEB1, a second gate interconnection portion GHB2 including a second gate electrode portion GEB2, and a third gate interconnection portion GHB3.

First gate interconnection portion GHB1 including first gate electrode portion GEB1 is formed in parallel to the Y-axis direction (a second direction) toward power supply interconnection VM and extends to a prescribed position within element formation region PER. Second gate interconnection portion GHB2 including second gate electrode portion GEB2 is formed in parallel to a direction obliquely bent with respect to the Y-axis direction (a third direction) from first gate interconnection portion GHB1 toward power supply interconnection VM and extends across a boundary between element formation region PER and element isolation insulating film EB, which is in parallel to the X-axis direction (the first direction). Third gate interconnection portion GHB3 further extends in parallel to the Y-axis direction (the second direction) from second gate interconnection portion GHB2 toward power supply interconnection VM.

It is noted that, owing to symmetry of a pattern, likewise the portion intersecting element formation region PER, a portion of gate interconnection portion GHB intersecting element formation region NER also includes gate interconnection portions corresponding to first gate interconnection portion GHB1, second gate interconnection portion GHB2, and third gate interconnection portion GHB3, respectively (see FIG. 2).

In the semiconductor device described above, by bending gate interconnection portion GHB, the cell of the inverter circuit can be smaller in size than the cell of the conventional inverter circuit, description of which will follow.

Figure 5:
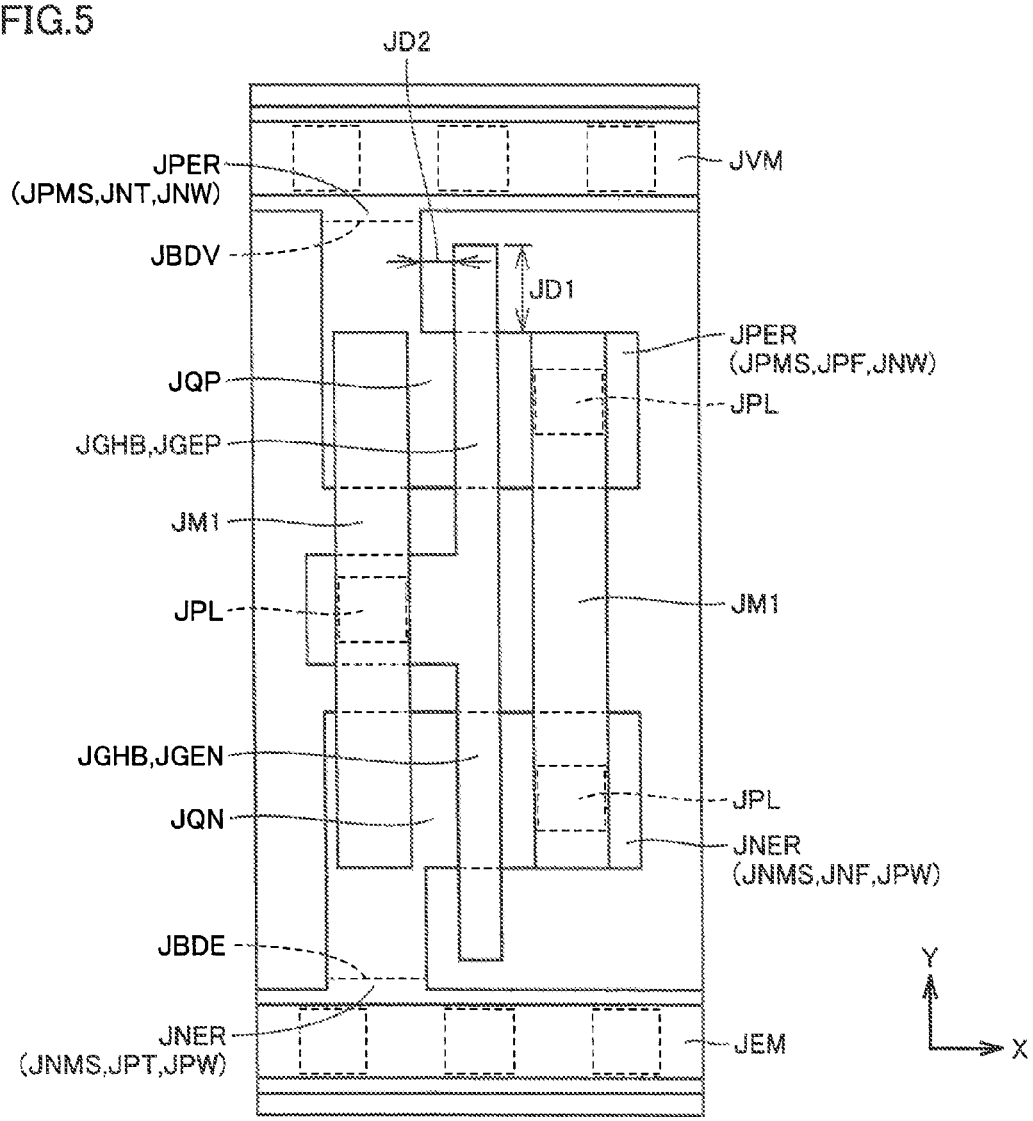
FIG. 5 is a plan view showing a cell of an inverter circuit in a semiconductor device according to a comparative example.

As shown in FIG. 5, in a cell of an inverter circuit according to a comparative example, element formation regions JPER, JNER are defined by an element isolation insulating film JEB. A power supply interconnection JVM and a ground interconnection extend in the X-axis direction at a distance from each other. A gate interconnection portion JGHB is formed in the Y-axis direction orthogonal to the X-axis direction. In gate interconnection portion JGHB, both of a portion intersecting element formation region JPER which will serve as a gate electrode portion JGEP and a portion intersecting element formation region JNER which will serve as a gate electrode portion JGEN extend in parallel to the Y-axis direction, without being bent.

Gate interconnection portion JGHB is electrically connected to a first metal interconnection JM1 through a plug JPL. In addition, power supply interconnection JVM is electrically connected to one source and drain (a metal silicide film JPMS) of a p-channel type field effect transistor JQP through plug JPL. A ground interconnection JEM is electrically connected to one source and drain (a metal silicide film JNMS) of an n-channel type field effect transistor JQN through plug JPL. The other source and drain (metal silicide film JPMS) of p-channel type field effect transistor JQP and the other source and drain (metal silicide film JNMS) of n-channel type field effect transistor JQN are electrically connected through first metal interconnection JM1 and plug JPL.

In the cell of the inverter circuit according to the comparative example, two first metal interconnections JM1 are formed in parallel to the Y-axis direction at a distance from each other. In addition, plug JPL electrically connecting one first metal interconnection JM1 and gate interconnection portion JGHB to each other is formed. Moreover, plug JPL electrically connecting the other first metal interconnection JM1 and each of sources and drains of two field effect transistors JQP, JQN to each other is formed.

Normally in such a cell of the inverter circuit, a length three times as long as a pitch of first metal interconnection JM1 (3 pitches) is required in the X-axis direction. Here, the pitch is set to a minimum pitch of the first metal interconnection, and it is a length which is the sum of an interconnection width of the first metal interconnection and an interval between adjacent first metal interconnections. On the other hand, for example, a length of 6 grids is required in the Y-axis direction. A length of 1 grid is equal to a length of 1 pitch.

In p-channel type field effect transistor JQP and n-channel type field effect transistor JQN, in order to exhibit desired performance as a field effect transistor, gate interconnection portion JGHB should intersect element formation region JPER and element formation region JNER, with a prescribed interconnection width or the like (a shape).

Gate interconnection portion JGHB, however, may have a large or small interconnection width, due to variation in manufacturing of a semiconductor device. In addition, a position thereof may be displaced. Taking into consideration such variation in manufacturing, as shown in FIG. 5, in gate interconnection portion JGHB, a prescribed length (a length JD1) should extend from element formation region JPER beyond a boundary between element formation region JPER and element isolation insulating film JEB to above element isolation insulating film JEB. This is also the case with gate interconnection portion JGHB intersecting element formation region JNER, because of symmetry of the pattern.

In addition, restriction as follows is imposed on an extension portion (length JD1) of this gate interconnection portion JGHB. Metal silicide film JPMS is formed on a surface of each of a portion of element formation region JPER located directly under power supply interconnection JVM and a portion of element formation region JPER where a channel of field effect transistor JQP is formed, so as to cover an N+ impurity region JNT and a P+ impurity region JPF. Namely, metal silicide film JPMS is formed to cover a boundary between N+ impurity region JNT and P+ impurity region JPF called butting diffusion JBDV (JBDE).

As described above, when gate interconnection portion JGHB (the extension portion (length JD1) of gate interconnection portion JGHB) is formed to two-dimensionally lie over butting diffusion due to variation in manufacturing of a semiconductor device, a region (width) of metal silicide film JPMS is further narrowed and break of metal silicide film JPMS is concerned. This is also the case with butting diffusion JBDE, because of symmetry of the pattern.

If such break should be avoided, in consideration of variation in manufacturing, the extension portion (length JD1) of gate interconnection portion JGHB should be spaced away by a prescribed distance JD2 from the portion of element formation region JPER where butting diffusion is located, such that the extension portion does not two-dimensionally lie over the portion of element formation region JPER. Therefore, in the semiconductor device according to the comparative example, in particular, it is not easy to shorten a length in the X-axis direction, in connection with a dimension of the cell of the inverter circuit.

In contrast to the semiconductor device according to the comparative example, in the semiconductor device according to the embodiment described above, gate interconnection portion GHB includes first gate interconnection portion GHB1, second gate interconnection portion GHB2, and third gate interconnection portion GHB3. In particular, second gate interconnection portion GHB2 is formed in parallel to the direction obliquely bent with respect to the Y-axis direction (the third direction) from first gate interconnection portion GHB1 toward power supply interconnection VM, and extends across the boundary between element formation region PER and element isolation insulating film EB, which is in parallel to the X-axis direction (the first direction). Third gate interconnection portion GHB3 further extends in parallel to the Y-axis direction (the second direction) from second gate interconnection portion GHB2 toward power supply interconnection VM.

Therefore, as shown in FIG. 4, while a length D1 of third gate interconnection portion GHB3 is ensured, a distance D2 between third gate interconnection portion GHB3 and a portion of element formation region PER can also be ensured. In addition, this is also the case with element formation region NER, because of symmetry of the pattern. Thus, even when a length in the X-axis direction as a dimension of the cell of the inverter circuit is decreased by 1 pitch, gate interconnection portion GHB can be prevented from two-dimensionally lying over the portion of element formation region PER (NER). In addition, since gate interconnection portion GHB is bent, a length in the Y-axis direction can also be shortened.

Figure 6:
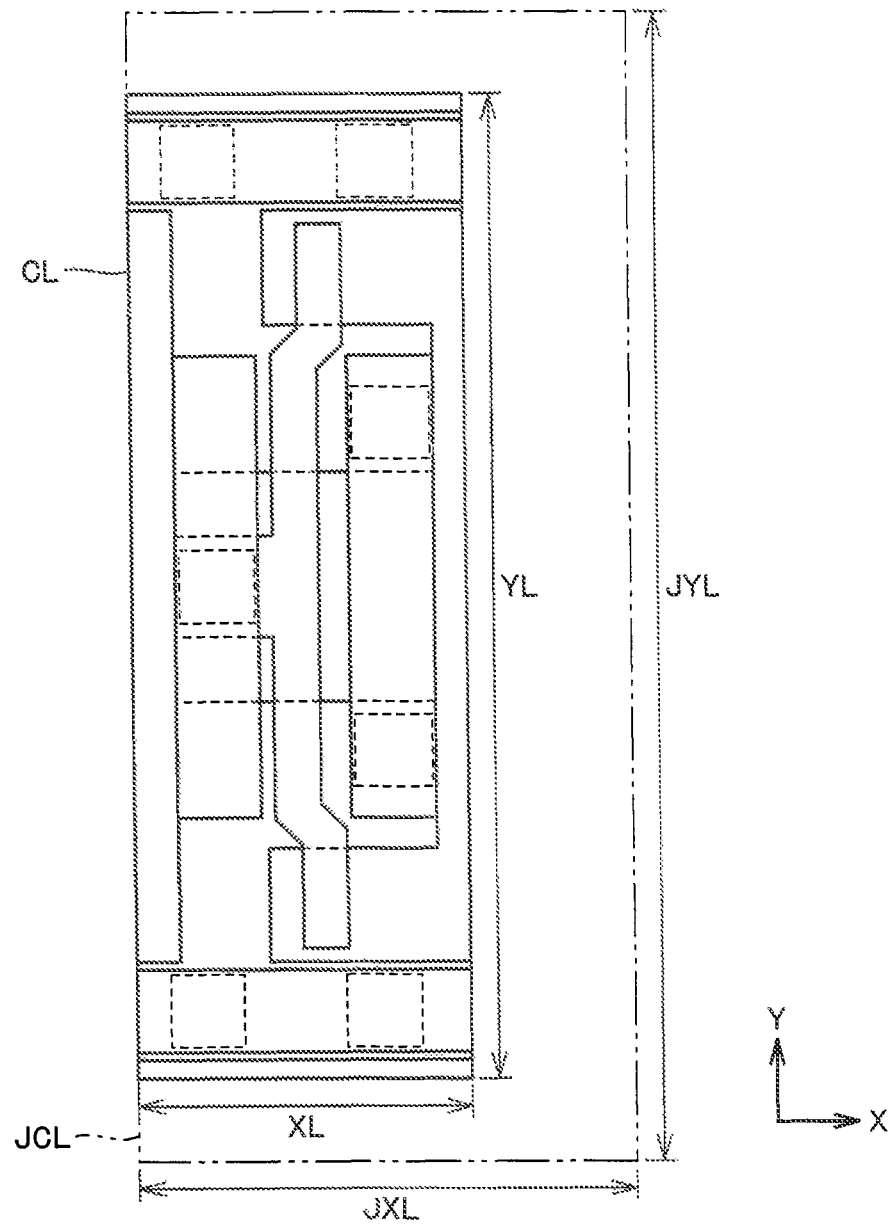
FIG. 6 is a plan view for comparison in the first embodiment of a size between the cell of the inverter circuit according to the first embodiment and the cell of the inverter circuit according to the comparative example.

Consequently, as shown in FIG. 6, the cell of the inverter circuit in the semiconductor device according to the comparative example has a length JXL in the X-axis direction of 3 pitches and a length JYL in the Y-axis direction of 7 grids, whereas the semiconductor device according to the embodiment described above has a length XL in the X-axis direction of 2 pitches and a length YL in the Y-axis direction of 6 grids. Thus, an area occupied by the cell of the inverter circuit can be decreased by approximately 57%.

For example, if a minimum pitch of first metal interconnection M1 or the like is assumed as 360 nm, the semiconductor device according to the comparative example having 3 pitches and 7 grids has a length in the X-axis direction of 1080 nm (360 nm×3) and a length in the Y-axis direction of 2520 nm (360 nm×7). In contrast, the semiconductor device described above having 2 pitches and 6 grids has a length in the X-axis direction of 720 nm (360 nm×2) and a length in the Y-axis direction of 2160 nm (360 nm×6).

In addition, in the semiconductor device described above, gate interconnection portion GHB does not two-dimensionally lie over the portion of element formation region PER, and therefore break of metal silicide film PMS in butting diffusion BDV is no longer concerned. Moreover, this is also the case with metal silicide film NMS located in butting diffusion BDE, on the side of element formation region NER.

It is noted that, if further current drive capability is required as a semiconductor device, with a length in the X-axis direction (2 grids) being maintained, in connection with a length in the Y-axis direction (grid), a length in the Y-axis direction of N well NW or P well PW may be extended by 1 grid to 7 grids or extended by 2 grids to 8 grids.

A numeric value for a film thickness or the like exemplified in the embodiment described above is by way of example, and limitation thereto is not intended. In addition, a numeric value of 360 nm exemplified as a value for a pitch is also by way of example, and a pitch may be, for example, 400 nm or 480 nm. Any value allowing photolithography, within a value range from 240 nm to 1000 nm, can be applicable as a value for a pitch.

Second Embodiment

Figure 7:
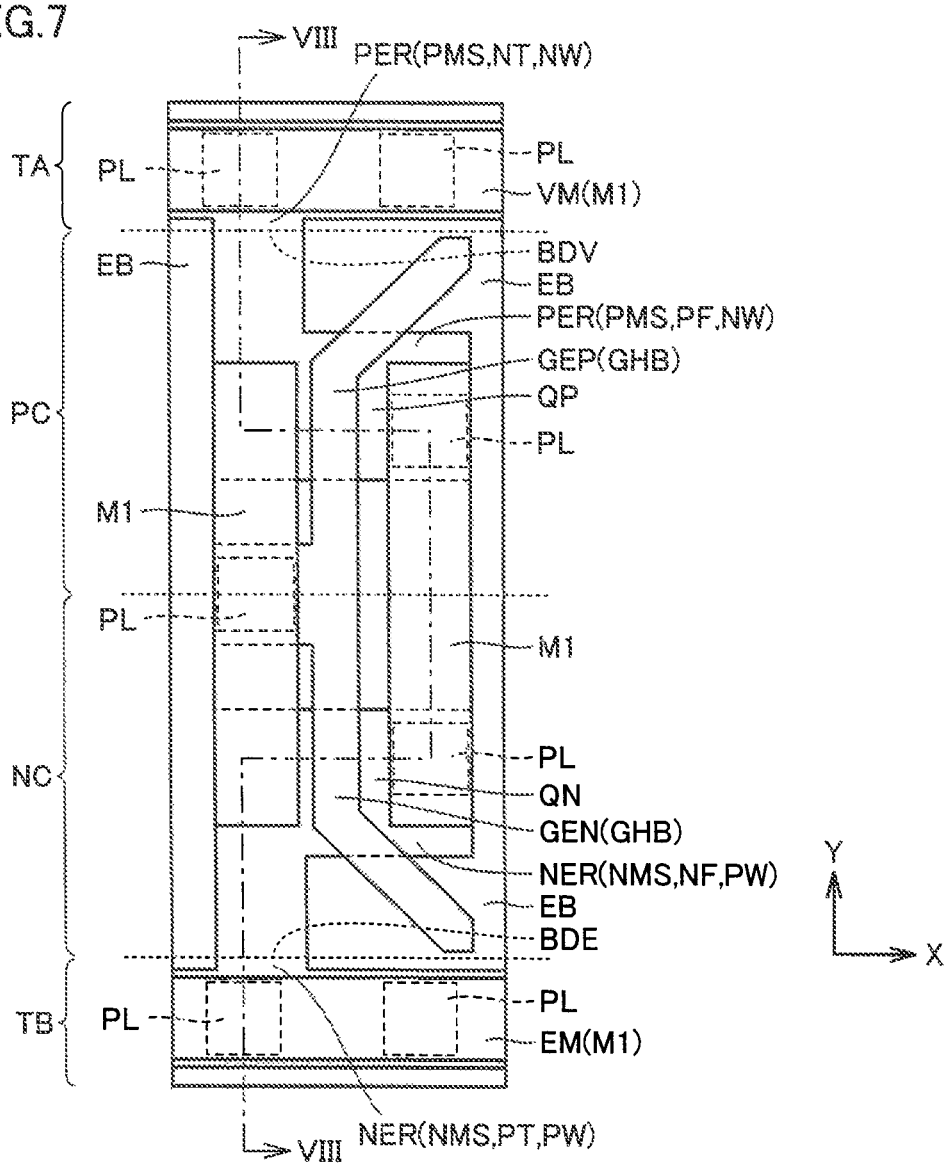
FIG. 7 is a plan view showing a cell of an inverter circuit in a semiconductor device according to a second embodiment of the present invention.
Figure 8:
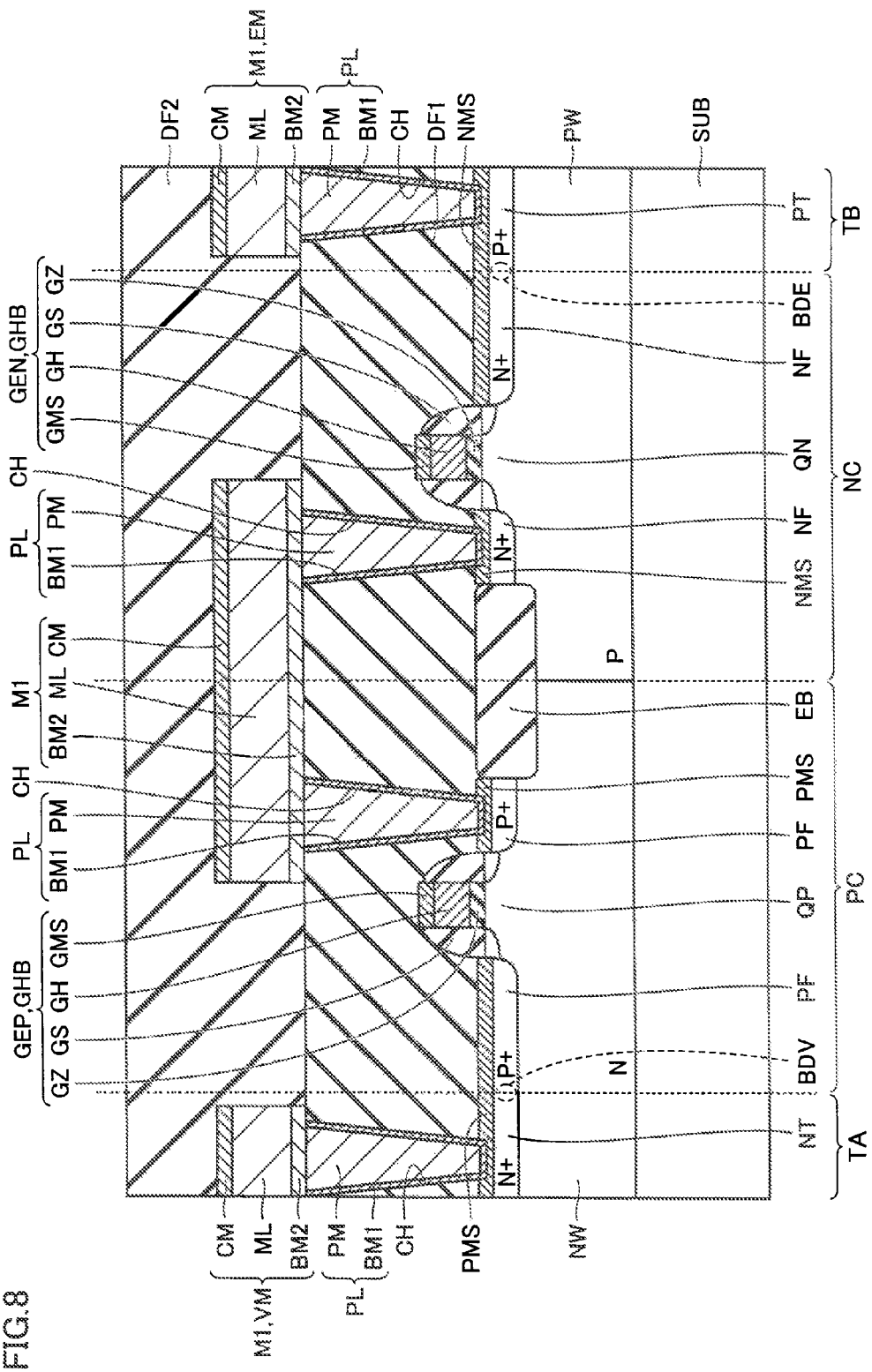
FIG. 8 is a cross-sectional view along the section line VIII-VIII shown in FIG. 7 in the second embodiment.
Figure 9:
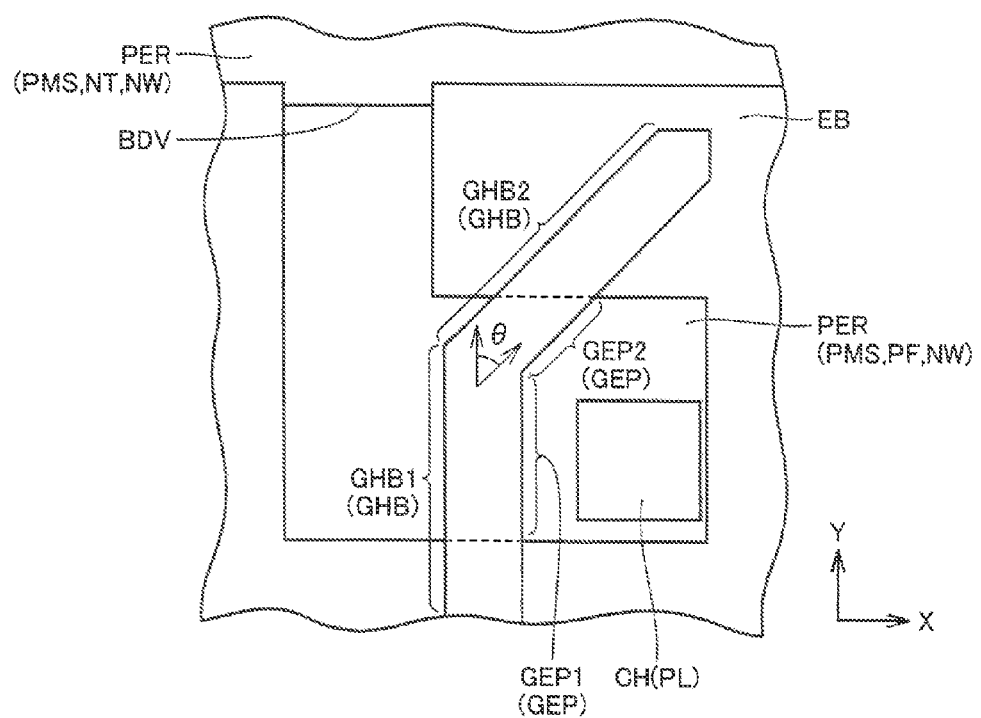
FIG. 9 is a partially enlarged plan view showing a gate interconnection portion and a portion around the same in the second embodiment.

A first example of a semiconductor device in which a gate interconnection portion is bent once will be described in a second embodiment. As shown in FIGS. 7, 8, and 9, gate interconnection portion GHB includes first gate interconnection portion GHB1 including first gate electrode portion GEB1 and second gate interconnection portion GHB2 including second gate electrode portion GEB2.

First gate interconnection portion GHB1 including first gate electrode portion GEB1 is formed in parallel to the Y-axis direction (the second direction) toward power supply interconnection VM and extends to a prescribed position within element formation region PER. Second gate interconnection portion GHB2 including second gate electrode portion GEB2 is formed in parallel to the direction obliquely bent with respect to the Y-axis direction (the third direction) from first gate interconnection portion GHB1 and further extends over element isolation insulating film EB toward power supply interconnection VM, beyond the boundary between element formation region PER and element isolation insulating film EB. An angle θ at which second gate interconnection portion GHB2 is bent with respect to first gate interconnection portion GHB1 is, for example, approximately 45°.

In addition, as shown in FIG. 9, for second gate interconnection portion GHB2, such a pattern that a width of gate interconnection portion GHB gradually decreases is adopted as a pattern for its terminal end portion. It is noted that features are otherwise the same as those in the semiconductor device described previously (see FIGS. 2 and 3) and therefore the same member has the same reference character allotted and description thereof will not be repeated.

In the semiconductor device described above, as shown in FIG. 9, gate interconnection portion GHB includes first gate interconnection portion GHB1 and second gate interconnection portion GHB2. In particular, second gate interconnection portion GHB2 is formed in parallel to the direction obliquely bent with respect to the Y-axis direction (the third direction) from first gate interconnection portion GHB1 and further extends over element isolation insulating film EB toward power supply interconnection VM, beyond the boundary between element formation region PER and element isolation insulating film EB.

Figure 10:
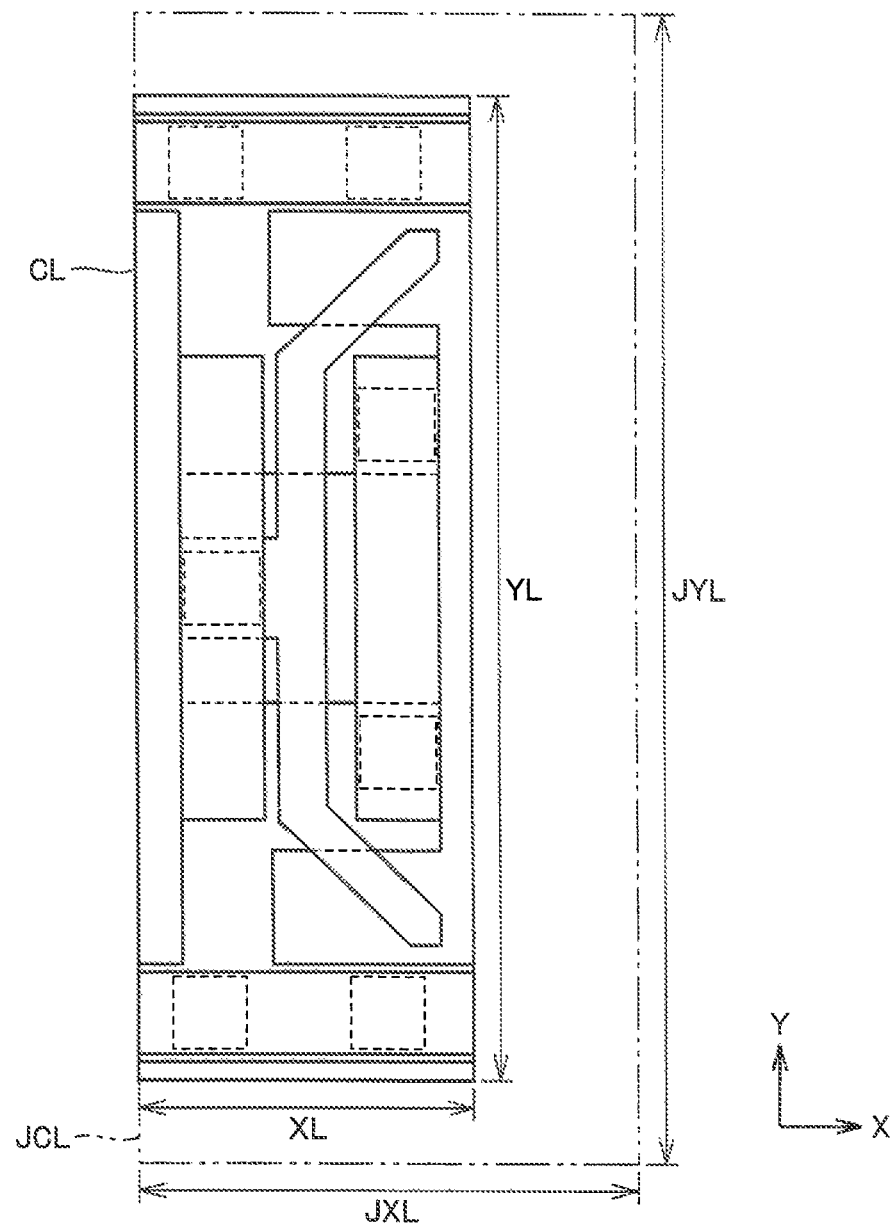
FIG. 10 is a plan view for comparison in the second embodiment of a size between the cell of the inverter circuit according to the second embodiment and the cell of the inverter circuit according to the comparative example.

Thus, as described in the first embodiment, as shown in FIG. 10, the cell of the inverter circuit in the semiconductor device according to the comparative example has length JXL in the X-axis direction of 3 pitches and length JYL in the Y-axis direction of 7 grids, whereas the semiconductor device according to the embodiment described above has length XL in the X-axis direction of 2 pitches and length YL in the Y-axis direction of 6 grids. Thus, an area occupied by the cell of the inverter circuit can be decreased by approximately 57%.

In addition, second gate interconnection portion GHB2 is gradually spaced apart from the portion of element formation region PER where butting diffusion BDV is located, so that break of metal silicide film PMS in butting diffusion BDV can reliably be prevented. This is also the case with the side where butting diffusion BDE is located, because of symmetry of the pattern.

Moreover, in gate interconnection portion GEM, second gate interconnection portion GHB2 is obliquely bent with respect to the Y-axis direction from first gate interconnection portion GHB1 and extends in the third direction toward power supply interconnection VM beyond the boundary between element formation region PER and element isolation insulating film EB. This is also the case with the gate interconnection portion intersecting element formation region NER, because of symmetry of the pattern. Thus, as compared with gate interconnection portion JGHB of the semiconductor device according to the comparative example described previously (see FIG. 5), a width of the gate interconnection main body (a length in the extension direction) can be increased and hence current drive capability can be enhanced.

For example, if angle θ formed by second gate interconnection portion GHB2 with respect to first gate interconnection portion GHB1 extending in the Y-axis direction is assumed as 45°, as compared with a case of gate interconnection portion JGHB of the semiconductor device according to the comparative example, a gate width in a region where second gate interconnection portion GHB2 is located can be increased up to approximately 1.4 times ($\sqrt{2}$). Thus, current drive power of a(n) n (p)-channel type field effect transistor can be enhanced.

Third Embodiment

A second example of a semiconductor device in which a gate interconnection portion is bent once will be described in a third embodiment.

Figure 11:
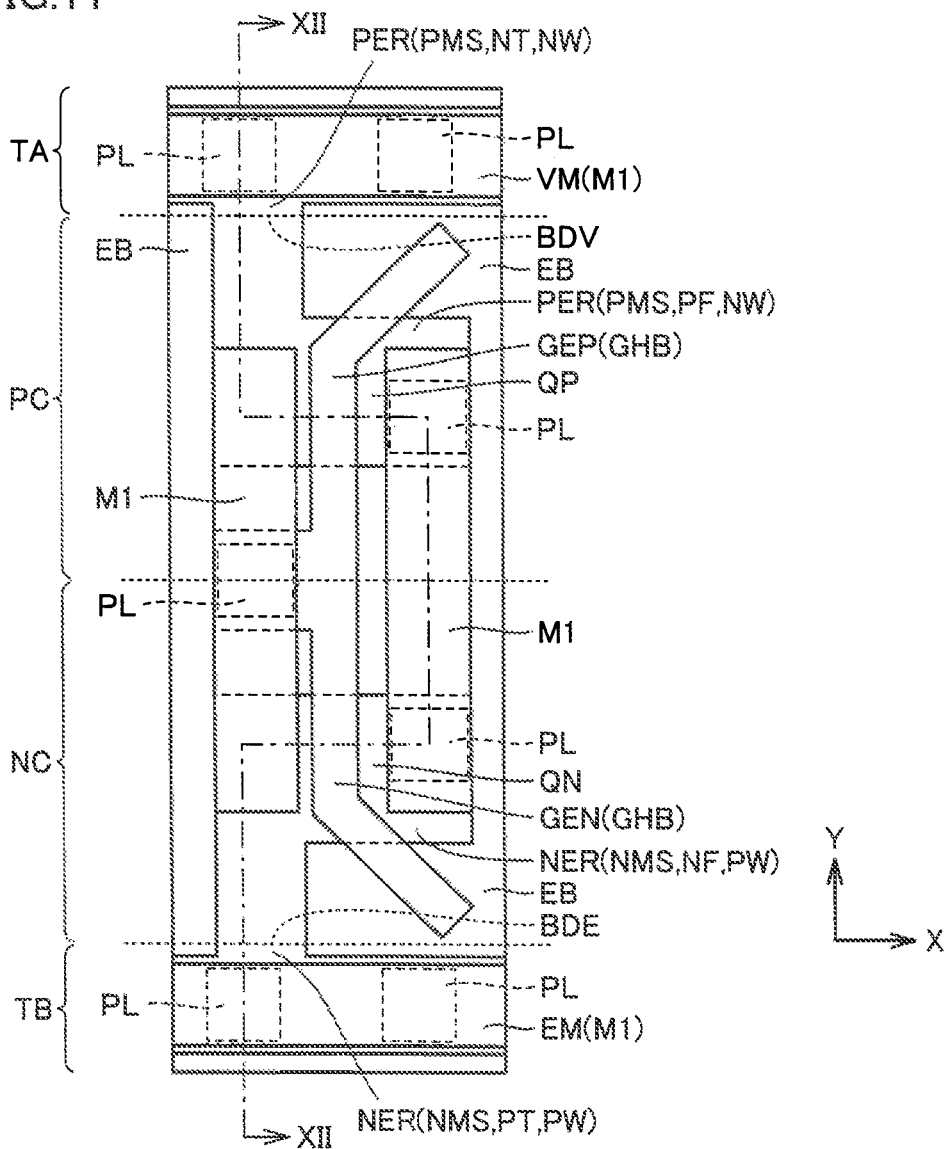
FIG. 11 is a plan view showing a cell of an inverter circuit in a semiconductor device according to a third embodiment of the present invention.
Figure 12:
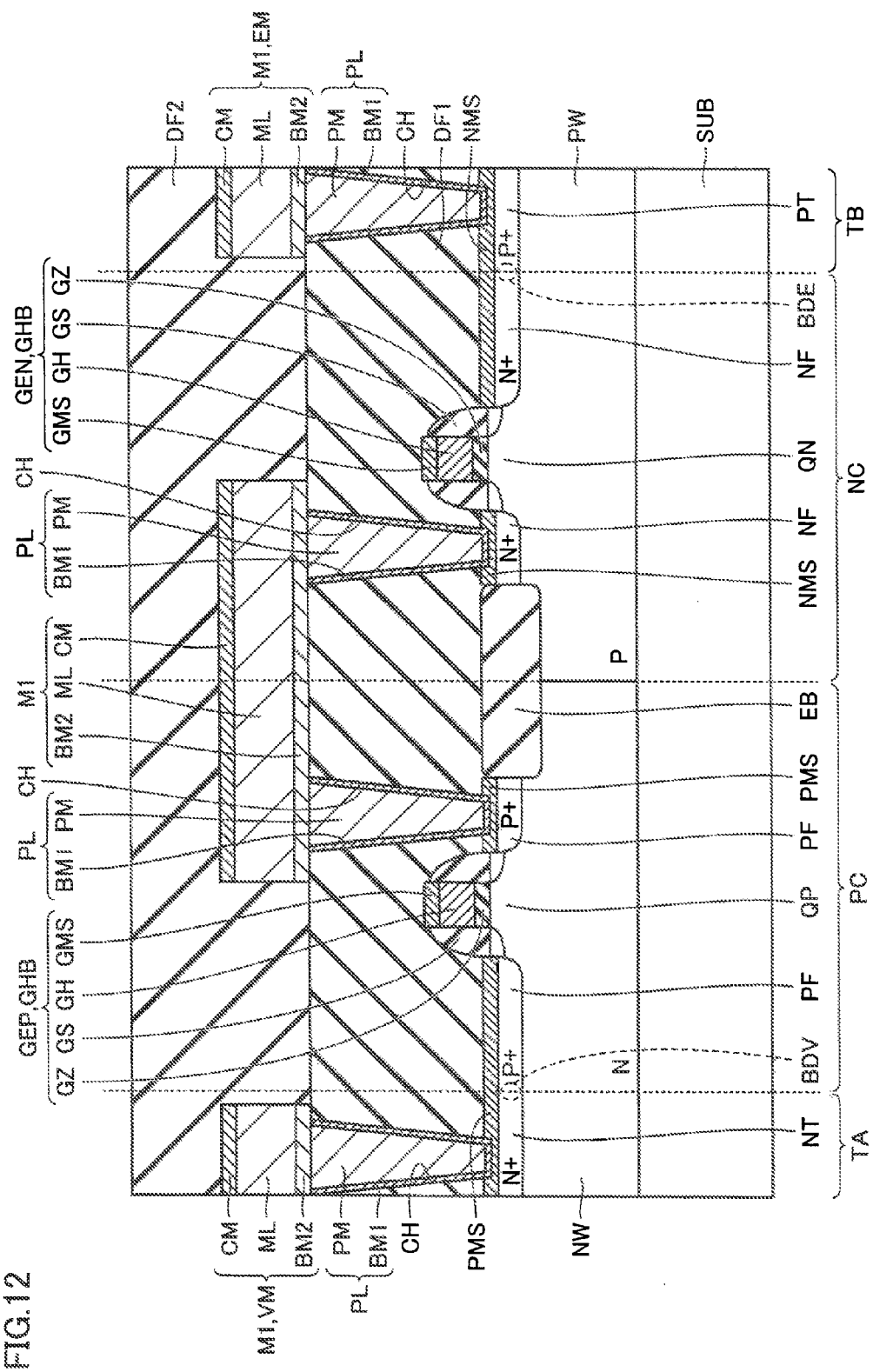
FIG. 12 is a cross-sectional view along the section line XII-XII shown in FIG. 11 in the third embodiment.
Figure 13:
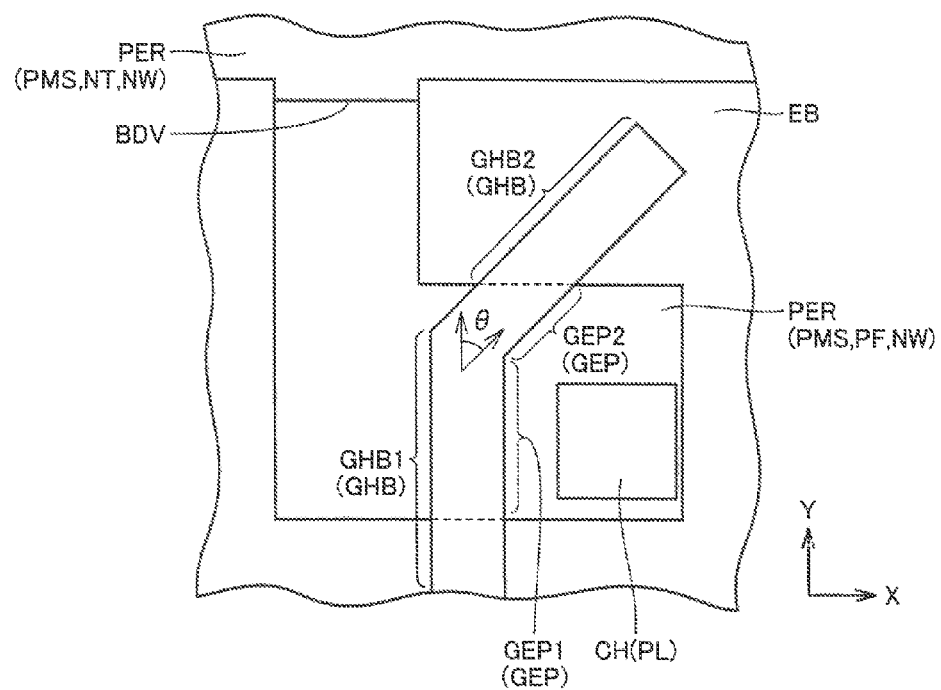
FIG. 13 is a partially enlarged plan view showing a gate interconnection portion and a portion around the same in the third embodiment.

As shown in FIGS. 11, 12, and 13, gate interconnection portion GHB includes first gate interconnection portion GHB1 including first gate electrode portion GEB1 and second gate interconnection portion GHB2 including second gate electrode portion GEB2.

First gate interconnection portion GHB1 including first gate electrode portion GEB1 is formed in parallel to the Y-axis direction (the second direction) toward power supply interconnection VM and extends to a prescribed position within element formation region PER. Second gate interconnection portion GHB2 including second gate electrode portion GEB2 is formed in parallel to the direction obliquely bent with respect to the Y-axis direction (the third direction) from first gate interconnection portion GHB1 and further extends over element isolation insulating film EB toward power supply interconnection VM, beyond the boundary between element formation region PER and element isolation insulating film EB. Angle θ at which second gate interconnection portion GHB2 is bent with respect to first gate interconnection portion GHB1 is, for example, approximately 45°.

In addition, as shown in FIG. 13, second gate interconnection portion GHB2 terminates at an end portion (an end surface) orthogonal to a direction of extension of the second gate interconnection portion. It is noted that features are otherwise the same as those in the semiconductor device described previously (see FIGS. 7, 8, and 9) and therefore the same member has the same reference character allotted and description thereof will not be repeated.

In the semiconductor device described above, as shown in FIG. 13, gate interconnection portion GHB includes first gate interconnection portion GHB1 and second gate interconnection portion GHB2. In particular, second gate interconnection portion GHB2 is formed in parallel to the direction obliquely bent with respect to the Y-axis direction (the third direction) from first gate interconnection portion GHB1 and further extends over element isolation insulating film EB toward power supply interconnection VM beyond the boundary between element formation region PER and element isolation insulating film EB.

Figure 14:
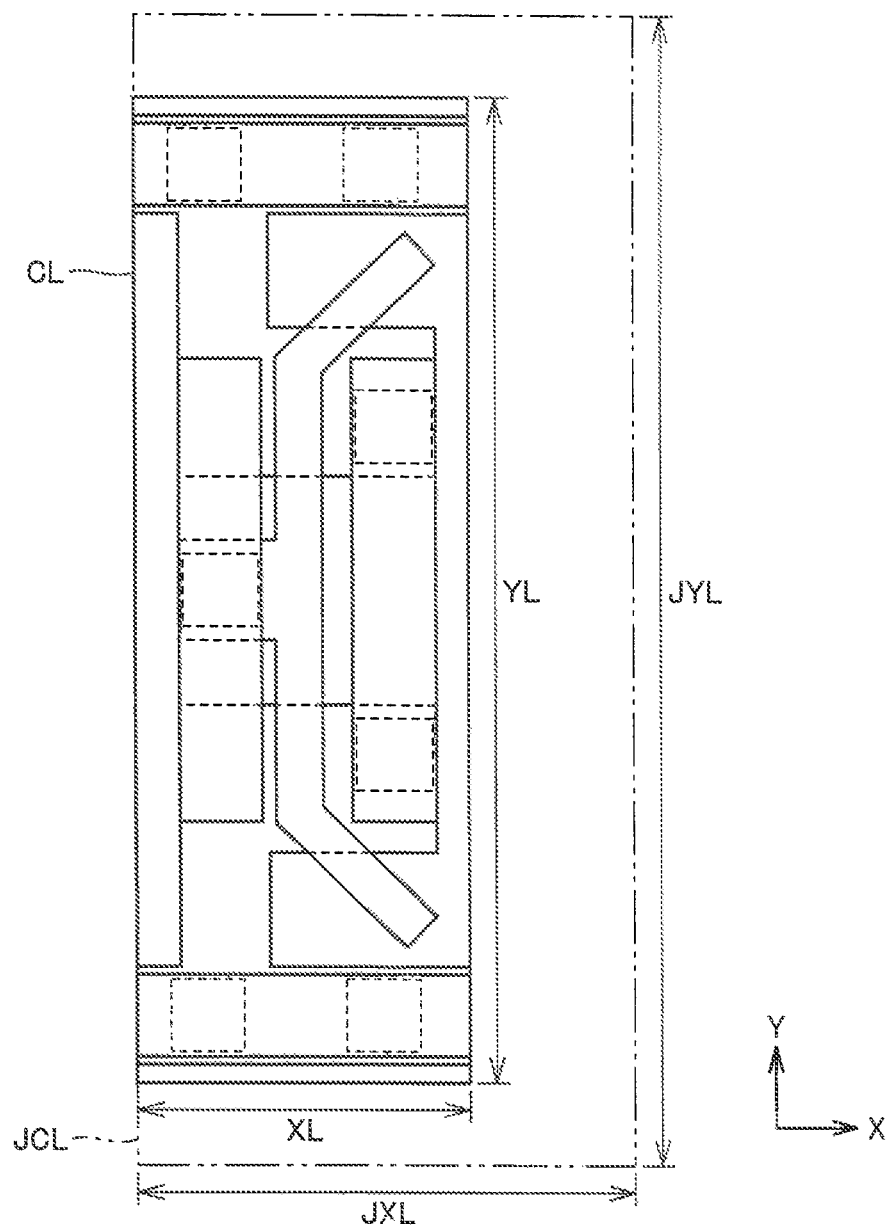
FIG. 14 is a plan view for comparison in the third embodiment of a size between the cell of the inverter circuit according to the third embodiment and the cell of the inverter circuit according to the comparative example.

Thus, as described in the first embodiment, as shown in FIG. 14, the cell of the inverter circuit in the semiconductor device according to the comparative example has length JXL in the X-axis direction of 3 pitches and length JYL in the Y-axis direction of 7 grids, whereas the semiconductor device according to the embodiment described above has length XL in the X-axis direction of 2 pitches and length YL in the Y-axis direction of 6 grids. Thus, an area occupied by the cell of the inverter circuit can be decreased by approximately 57%.

In addition, second gate interconnection portion GHB2 is gradually spaced apart from the portion of element formation region PER where butting diffusion BDV is located, so that break of metal silicide film PMS in butting diffusion BDV can reliably be prevented. This is also the case with the side where butting diffusion BDE is located, because of symmetry of the pattern.

Moreover, in gate interconnection portion GHB, second gate interconnection portion GHB2 is obliquely bent with respect to the Y-axis direction from first gate interconnection portion GHB1 and extends in the third direction toward power supply interconnection VM beyond the boundary between N well NW and element isolation insulating film EB. This is also the case with the gate interconnection portion intersecting element formation region NER, because of symmetry of the pattern. Thus, as compared with gate interconnection portion JGHB of the semiconductor device according to the comparative example described previously (see FIG. 5), a width of the gate interconnection main body (a length in the extension direction) can be increased and hence current drive capability can be enhanced.

(As to Patterning of Gate Interconnection Portion and Optical Proximity Correction)

As described already, in order for a gate electrode portion (a gate interconnection portion) to intersect element formation region PER and element formation region NER with a prescribe dimension or the like, the gate interconnection portion should extend by a prescribed length from element formation region PER (NER) to above element isolation insulating film EB. A pattern (a shape) of the gate interconnection portion is substantially dependent on patterning of a gate interconnection main body. The gate interconnection main body is patterned, for example, by forming a resist pattern with photolithography on a polysilicon film or the like and then etching the polysilicon film or the like by using the resist pattern as a mask.

A photomask for the gate interconnection main body used in this photolithography is manufactured based on data of a gate mask pattern and the gate mask pattern is found based on a gate design pattern of the gate interconnection main body. Here, a process for correcting data of a gate design pattern is performed such that an actually formed resist pattern is close to a shape of the gate design pattern. This process is referred to as optical proximity correction (OPC).

In particular, in the cell of the inverter circuit described in the second and third embodiments, a bent second gate interconnection portion is provided as a gate interconnection portion extending from the element formation region to above the element isolation insulating film. Here, a photomask (a gate mask pattern) used for patterning of a gate electrode portion (a gate interconnection main body) including such a second gate interconnection portion and optical proximity correction will be described.

Figure 15:
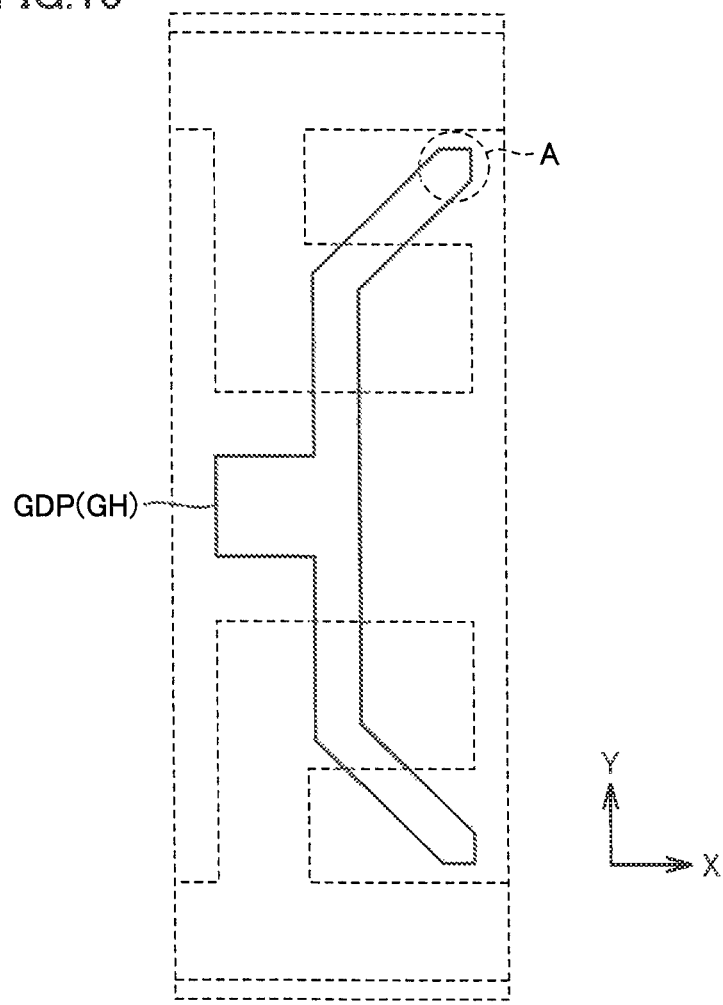
FIG. 15 is a plan view showing a gate design pattern of a gate interconnection main body according to the second embodiment, for illustrating optical proximity correction for a mask pattern for patterning the gate interconnection main body in the gate interconnection portion in the second embodiment.
Figure 16:
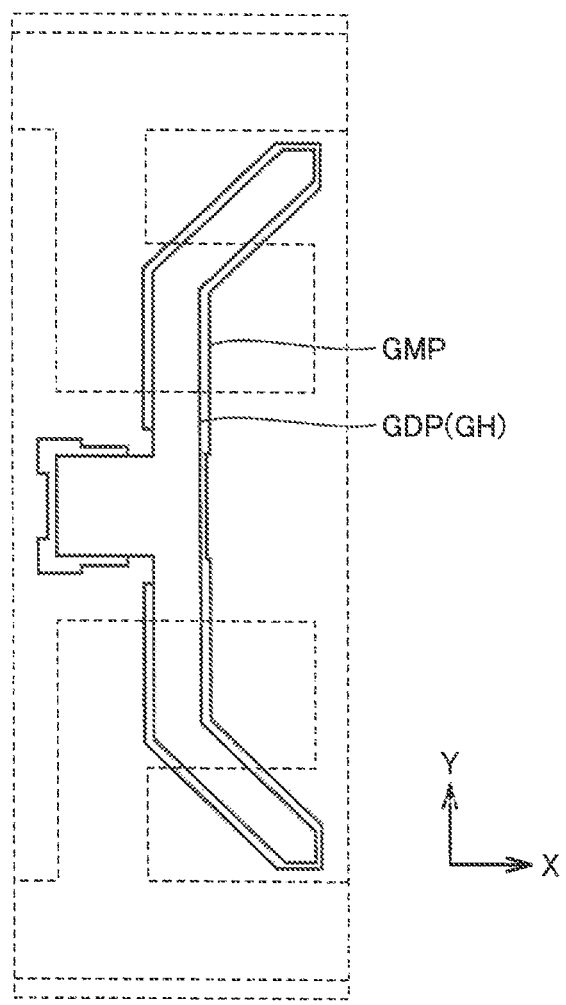
FIG. 16 is a plan view showing a gate mask pattern obtained by subjecting the gate design pattern of the gate interconnection main body according to the second embodiment to optical proximity correction, for illustrating optical proximity correction for the mask pattern for patterning the gate interconnection main body in the gate interconnection portion in the second embodiment.

Initially, FIG. 15 shows a gate design pattern GDP of gate interconnection main body GH of the cell of the inverter circuit according to the second embodiment, and FIG. 16 shows one example of a gate mask pattern GMP obtained by subjecting gate design pattern GDP to optical proximity correction. As shown in FIG. 15, in gate interconnection main body GH according to the second embodiment, in particular at a terminal end portion of gate design pattern GDP (within a dotted frame A), two terminal end sides are arranged such that a width of gate interconnection main body GH gradually decreases.

In a case of such a terminal end portion, owing to optical proximity correction, the gate mask pattern is not considerably corrected to such a shape as a hammerhead which will be described later. Therefore, as shown in FIG. 16, gate mask pattern GMP is such a pattern that gate design pattern GDP including its terminal end portion is generally expanded outward by a prescribed distance.

Figure 17:
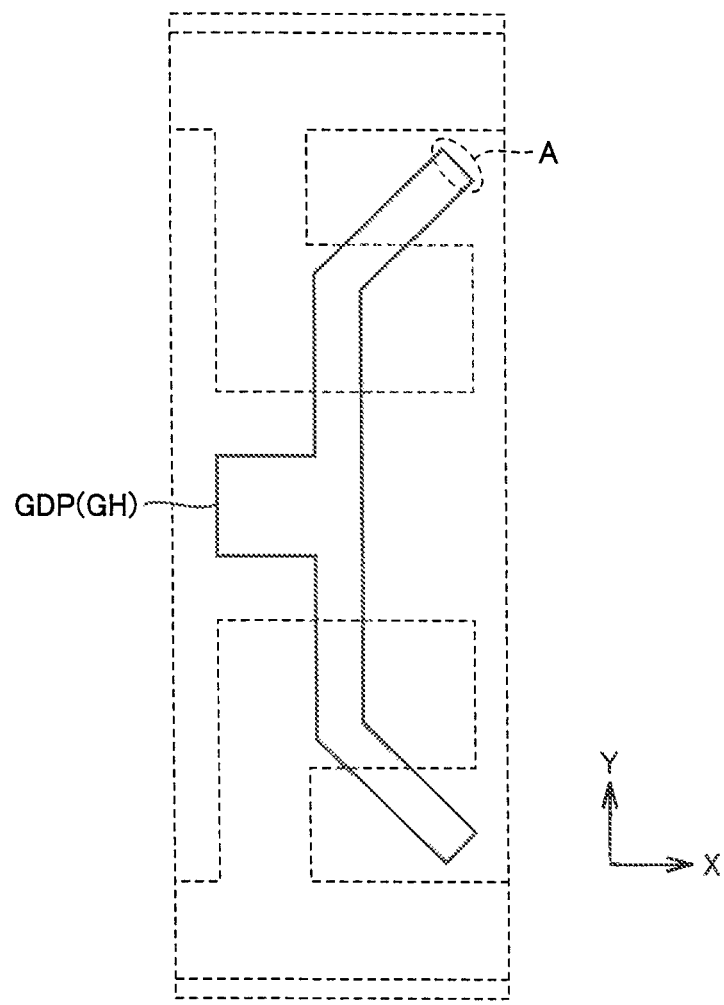
FIG. 17 is a plan view showing a gate design pattern of a gate interconnection main body according to the third embodiment, for illustrating optical proximity correction for a mask pattern for patterning the gate interconnection main body in the gate interconnection portion in the third embodiment.
Figure 18:
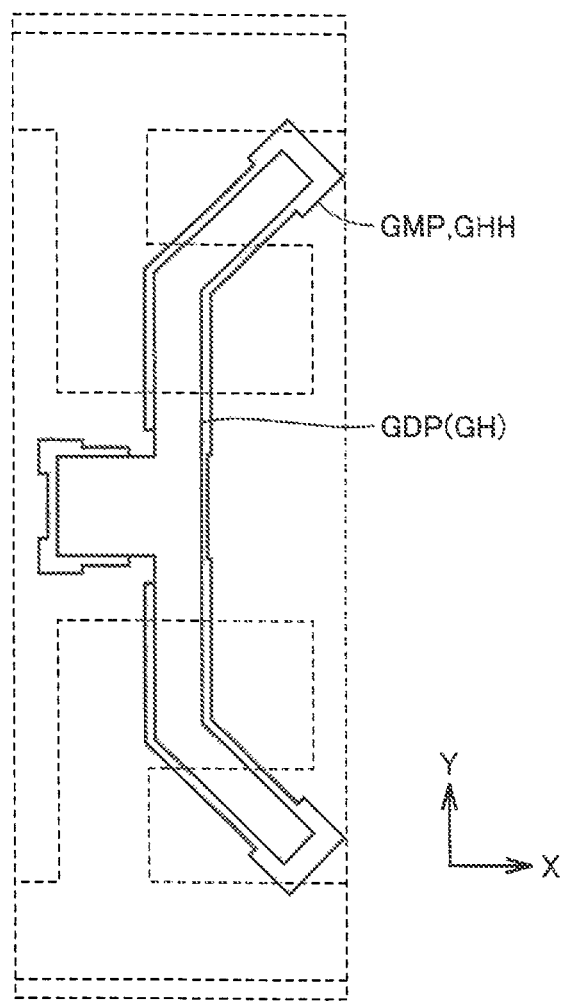
FIG. 18 is a plan view showing a gate mask pattern obtained by subjecting the gate design pattern of the gate interconnection main body according to the third embodiment to optical proximity correction, for illustrating optical proximity correction for the mask pattern for patterning the gate interconnection main body in the gate interconnection portion in the third embodiment.

Then, FIG. 17 shows gate design pattern GDP of gate interconnection main body GH of the semiconductor device according to the third embodiment, and FIG. 18 shows one example of gate mask pattern GMP obtained by subjecting gate design pattern GDP to optical proximity correction. As shown in FIG. 17, in gate interconnection main body GH according to the third embodiment, in particular at a terminal end portion of gate design pattern GDP (within dotted frame A), one terminal end side orthogonal to two sides corresponding to opposing side surfaces of gate interconnection main body GH is arranged. Namely, a terminal end side corresponding to an end surface in a direction orthogonal to a direction of extension of the gate interconnection main body is arranged.

In a case of such a terminal end portion, owing to optical proximity correction, correction for considerably expanding outward a pattern of the terminal end portion is carried out (a design automation (DA) process). Therefore, as shown in FIG. 18, at a terminal end portion of gate mask pattern GMP, a hammerhead pattern GHH like a hammerhead is obtained. On the other hand, in a portion other than the terminal end portion, such a pattern that gate design pattern GDP is generally expanded outward by a prescribed distance is obtained.

By subjecting the terminal end portion to photolithography using gate mask pattern GMP including hammerhead pattern GHH, a terminal end portion of an actually formed resist pattern is prevented from considerably retracting from a position corresponding to the terminal end portion of the gate design pattern. Thus, in particular in the cell of the inverter circuit according to the third embodiment, a pattern more faithful to the gate design pattern can be formed as the gate interconnection main body. Consequently, as a cell of an inverter circuit, deterioration or variation of characteristics of a field effect transistor of both of the p-channel type and the re-channel type can be suppressed.

In addition, in a layout of a logic circuit constructed by combining a plurality of cells, depending on arrangement of cells, a portion where bent second gate interconnection portions are close to each other or a portion otherwise are present. In particular, in the portion where terminal end portions of the second gate interconnection portions are close to each other, a process for further correcting data of a gate design pattern (a mask pattern data specification (MPD) process) is performed such that a hammerhead pattern is physically drawn. Namely, a process for causing a part of a pattern to retract is performed such that hammerhead patterns close to each other are spaced apart from each other in accordance with how close they are.

Figure 19:
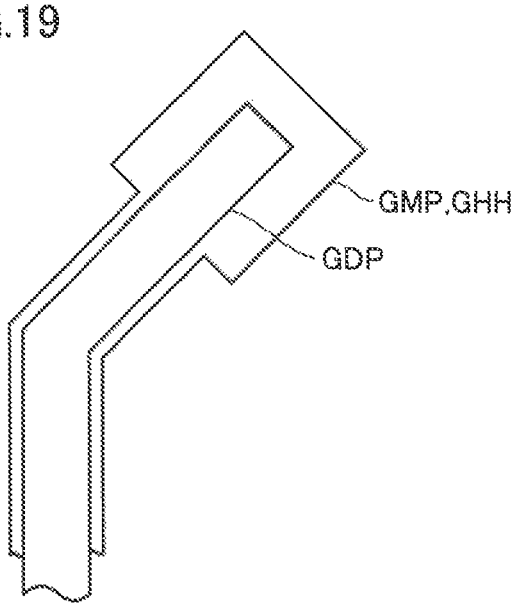
FIG. 19 is a partially enlarged plan view showing one example of a gate mask pattern serving as a reference, in a case where a gate design pattern of the gate interconnection main body is subjected to optical proximity correction in the third embodiment.
Figure 20:
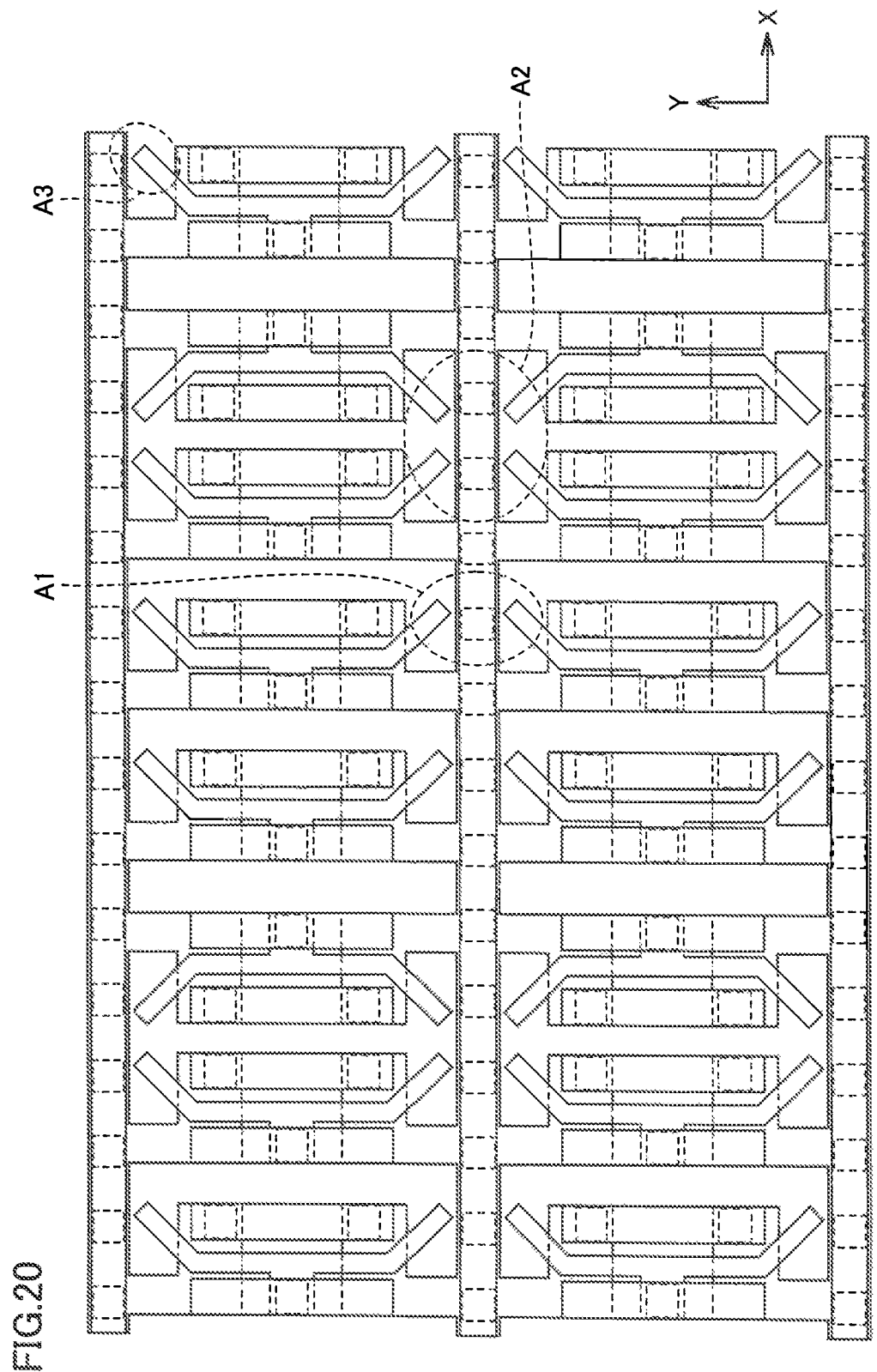
FIG. 20 is a plan view showing an array in which a plurality of cells are arranged in the third embodiment.

For example, gate mask pattern GMP (GHH) shown in FIG. 19 is assumed as a gate mask pattern including a standard (reference) hammerhead pattern resulting from optical proximity correction. In addition, a layout shown in FIG. 20 is assumed as an array in which a plurality of cells of inverter circuits are arranged.

Figure 21:
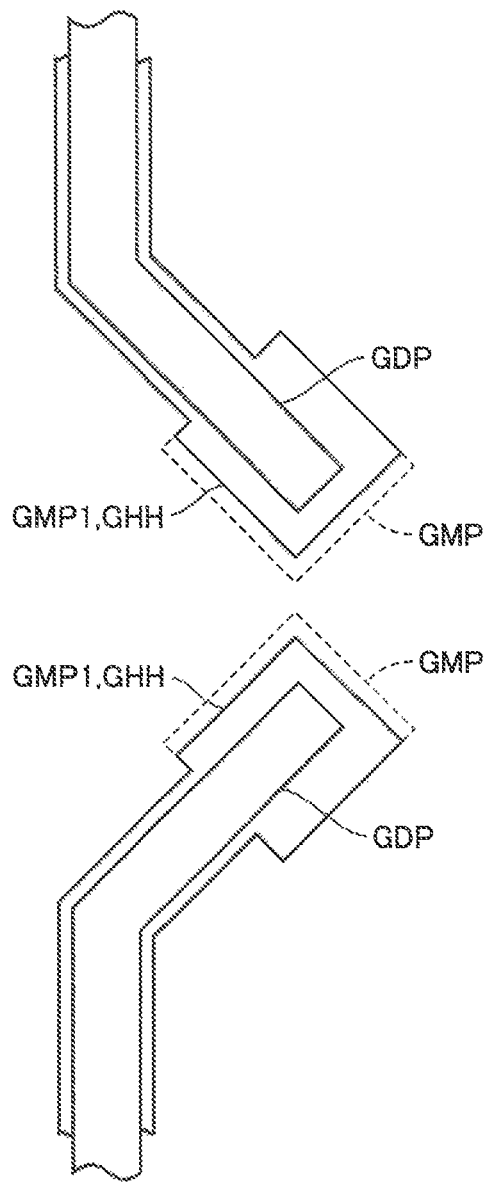
FIG. 21 is a first partially enlarged plan view showing one example of a gate mask pattern obtained by further subjecting the gate mask pattern serving as the reference to correction, depending on an arrangement pattern of the gate interconnection portion in the third embodiment.

In such a layout, for example as shown within a dotted frame A1, there is a portion where second gate interconnection portions of two gate interconnection portions are close to each other. In such a portion, as shown in FIG. 21, data is corrected to obtain such a gate mask pattern GMP1 that sides opposed to each other are caused to retract from gate mask pattern GMP serving as the reference, with sides not opposed to each other being left as they are.

Figure 22:
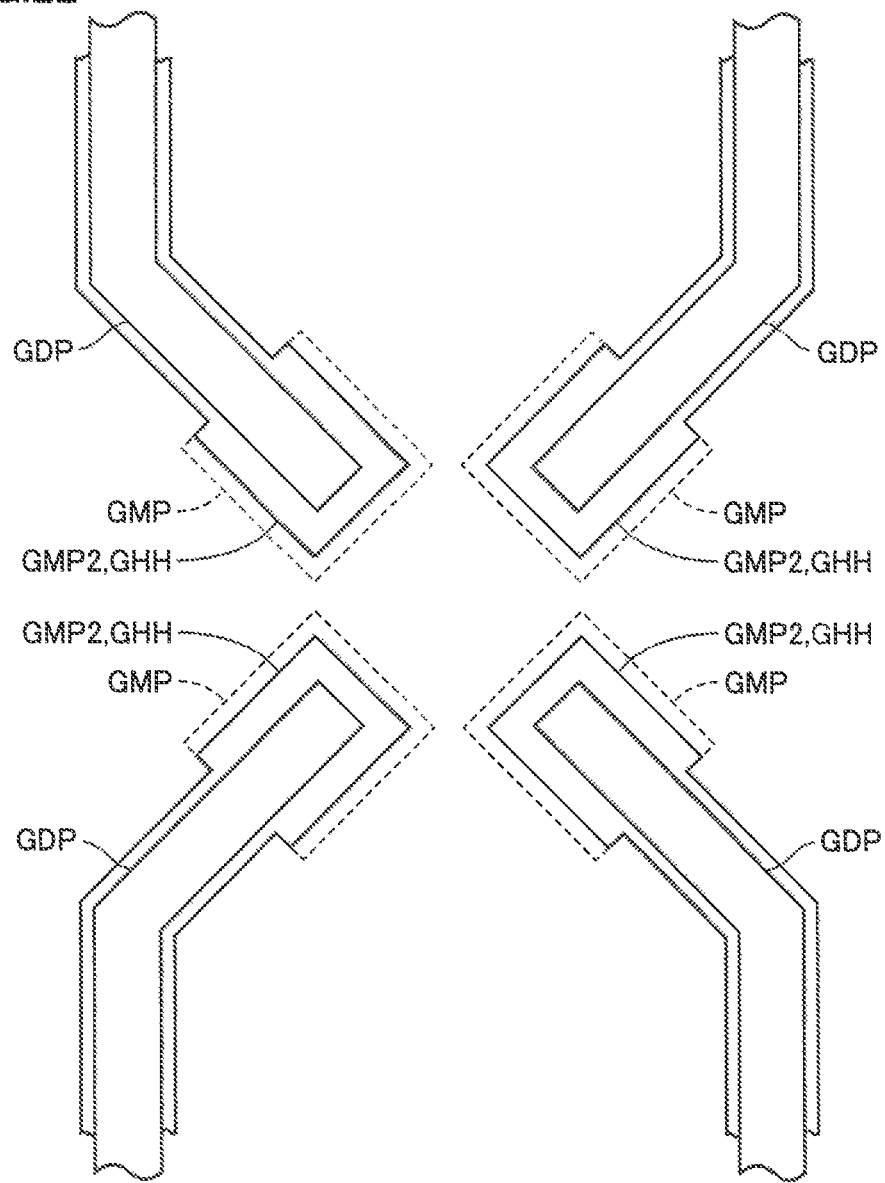
FIG. 22 is a second partially enlarged plan view showing one example of a gate mask pattern obtained by further subjecting the gate mask pattern serving as the reference to correction, depending on an arrangement pattern of the gate interconnection portion in the third embodiment.

In addition, as shown within a dotted frame A2, there is a portion where second gate interconnection portions of four gate interconnection portions are close to one another. In such a portion, as shown in FIG. 22, data is corrected to obtain such a gate mask pattern GMP2 that sides opposed to one another are caused to retract from gate mask pattern GMP serving as the reference.

On the other hand, as shown within a dotted frame A3, in a gate interconnection portion spaced apart from other gate interconnection portions, gate mask pattern GMP (see FIG. 19) serving as the reference is employed as it is as the gate mask pattern.

By performing such a process (the MPD process), such a gate mask pattern that a terminal end portion of a gate interconnection main body is in a hammerhead pattern can reliably be drawn on a photomask. Thus, a gate interconnection main body more faithful to a gate design pattern can be formed as a logic circuit. Consequently, a stable operation as a logic circuit can be achieved.

It is noted that a case where angle θ at which second gate interconnection portion GHB2 is bent with respect to first gate interconnection portion GHB1 is set to 45° has been described by way of example in each embodiment described above. As this angle θ, 45° is desirable in forming a gate mask pattern of a gate interconnection main body through electronic drawing.

This angle θ, however, is not limited to 45°, and an angle should only be within a range from 20° to 80°. When angle θ is smaller than 20°, in terms of an ensured length of a second gate interconnection portion extending from an element formation region to above an element isolation insulating film, the second gate interconnection portion is close to the Y-axis direction and a length in a grid direction is disadvantageous in terms of a layout.

In addition, when second gate interconnection portion GHB2 is close to a portion of an element formation region in the vicinity of butting diffusion BDV (BDE) and a region where a metal silicide film is formed is narrowed due to variation in manufacturing, increase in resistance is concerned.

On the other hand, when angle θ is greater than 80°, the second gate interconnection portion is close to the X-axis direction, and when gate interconnection portions of adjacent cells are close to each other, there is no margin for short-circuiting.

A numeric value for a film thickness, a dimension, or the like exemplified in each embodiment is by way of example, and limitation thereto is not intended. In addition, in an actually manufactured semiconductor device, a structure of a gate interconnection portion in parallel to the Y-axis direction or a structure of a power supply interconnection and a ground interconnection in parallel to the X-axis direction does not intend a structure mathematically in parallel to the Y (X)-axis direction but includes manufacturing errors. Moreover, with regard to an angle or the like formed by a second gate interconnection portion with respect to a first gate interconnection portion as well, a mathematically strict angle is not intended, and it also naturally includes manufacturing errors. Regarding a semiconductor device including a gate interconnection portion described above, limitation to a cell of an inverter circuit is not intended, and application to a semiconductor device including a gate interconnection portion intersecting an element formation region is acceptable.

The embodiments disclosed herein are illustrative and non-restrictive. The present invention is defined by the terms of the claims, rather than the scope described above, and is intended to include any modifications within the scope and meaning equivalent to the terms of the claims.

INDUSTRIAL APPLICABILITY

The present invention can contribute to reduction in size of a semiconductor device including a logic circuit or the like.

REFERENCE SIGNS LIST

INV inverter circuit; QP p-channel type field effect transistor; QN n-channel type field effect transistor; SUB semiconductor substrate; EB element isolation insulating film; PER element formation region; NER element formation region; NW N well; PW P well; PC p-channel region; NC n-channel region; PF P+ impurity region; PMS metal silicide film; NF N+ impurity region; NMS metal silicide film; GHB gate interconnection portion; GHB1 first gate interconnection portion; GHB2 second gate interconnection portion; GHB3 third gate interconnection portion; GH gate interconnection main body; GZ gate insulating film; GS sidewall insulating film; GMS metal silicide film; GEP gate electrode portion; GEN gate electrode portion; TA tap portion; NT N+ impurity region; TB tap portion; PT P+ impurity region; BDV butting diffusion; BDE butting diffusion; DF1 first interlayer insulating film; DF2 second interlayer insulating film; CH contact hole; PL plug; BM1 barrier metal; PM embedding metal; M1 first metal interconnection; BM barrier metal layer; ML metal layer; CM cap metal layer; VM power supply interconnection; EM ground interconnection; CL cell; GDP gate design pattern; and GMP gate mask pattern.

The invention claimed is:

1. A semiconductor device including an inverter circuit in which complementary switching elements are connected in series between a power supply potential and a ground potential, comprising:

a semiconductor substrate having a main surface;

a power supply interconnection formed on a surface of said semiconductor substrate and extending in parallel to a first direction, to which a power supply potential is applied;

a ground interconnection formed on the surface of said semiconductor substrate and extending in parallel to said first direction at a distance from said power supply interconnection in a second direction orthogonal to said first direction, to which a ground potential is applied; and two element formation regions for said complementary switching elements, each defined by an element isolation insulating film in a region of said semiconductor substrate lying between said power supply interconnection and said ground interconnection, each said element formation region having formed
- a gate interconnection portion intersecting said element formation region,
- a source and a drain,
- a tap region electrically connected to a corresponding interconnection of said power supply interconnection and said ground interconnection, and
- a metal silicide film covering butting diffusion of said tap region and one of said source and said drain, said gate interconnection portion including
- a first gate interconnection portion formed in parallel to said second direction and extending toward a side where the corresponding interconnection is arranged to a prescribed position within said element formation region, and
- a second gate interconnection portion extending obliquely from said first gate interconnection portion toward said side where the corresponding interconnection is arranged, and extending obliquely across a boundary parallel to said first direction which is a boundary between said element formation region and said element isolation insulating film, said second gate interconnection portion being arranged such that a distance in parallel to said first direction between said butting diffusion and said second gate interconnection portion gradually increases as said second gate interconnection portion extends from said first gate interconnection portion.

2. The semiconductor device according to claim 1, wherein said gate interconnection portion includes a third gate interconnection portion extending in parallel to said second direction from said second gate interconnection portion.

3. The semiconductor device according to claim 1, wherein said second gate interconnection portion extends over said element isolation insulating film.

4. The semiconductor device according to claim 1, wherein an angle formed by said second gate interconnection portion with respect to said first gate interconnection portion is from 10° to 80°.

5. The semiconductor device according to claim 4, wherein an angle formed by said second gate interconnection portion with respect to said first gate interconnection portion is 45°.

6. The semiconductor device according to claim 1, wherein said gate interconnection portion includes a gate interconnection main body having opposing sides opposed at a distance from each other, and
said gate interconnection main body has a terminal end orthogonal to said opposing sides.

7. A semiconductor device, comprising:
a semiconductor substrate having a main surface; and
an element formation region defined by an element isolation insulating film in said semiconductor substrate,
said element formation region having formed
- a gate interconnection portion intersecting said element formation region,
- a source and a drain,
- a tap region to which a prescribed potential is applied, and
- a metal silicide film covering butting diffusion of said tap region and one of said source and said drain, said gate interconnection portion including
- a first gate interconnection portion formed in a direction orthogonal to a direction in which a boundary between said element formation region and said element isolation insulating film extends, toward said boundary, and extending to a prescribed position within said element formation region, and
- a second gate interconnection portion bending from said first gate interconnection portion and extending obliquely across said boundary, said second gate interconnection portion being arranged such that a distance, in parallel to said direction in which said boundary extends, between said butting diffusion and said second gate interconnection portion gradually increases as said second gate interconnection portion extends from said first gate interconnection portion.

* * * * *